United States Patent [19]
Wolf et al.

[11] Patent Number: 5,287,526
[45] Date of Patent: Feb. 15, 1994

[54] SYSTEM FOR SELECTIVELY MODIFYING CODES GENERATED BY A TOUCH TYPE KEYBOARD UPON DETECTING PREDETERMINED SEQUENCE OF MAKE/BREAK CODES AND EXPIRATION OF PREDEFINED TIME INTERVAL

[75] Inventors: Chris L. Wolf, 23454 - 25th Ave. South, Des Moines, Wash. 98198; Michael F. Maikowski, Des Moines, Wash.; Winston N. Martin, Bellevue, Wash.; Walter E. Lindsley, Jr., Selah, Wash.

[73] Assignee: Chris L. Wolf, Des Moines, Wash.

[21] Appl. No.: 542,482

[22] Filed: Jun. 22, 1990

Related U.S. Application Data

[63] Continuation-in-part of Ser. No. 853,302, Apr. 14, 1986, Pat. No. 4,937,778.

[51] Int. Cl.$^5$ .................... G06F 3/03; G06F 15/20
[52] U.S. Cl. .................. 395/800; 364/928.6; 364/947.5; 364/948.1; 364/DIG. 2; 364/709.12; 345/172
[58] Field of Search .......... 364/900, 706, 709, 709.12; 400/100, 98; 395/800; 340/711

[56] References Cited

U.S. PATENT DOCUMENTS

| | | | |
|---|---|---|---|
| 4,490,056 | 12/1984 | Whitaker | 400/100 |
| 4,669,901 | 6/1987 | Feng | 400/484 |
| 4,680,572 | 7/1987 | Meguire et al. | 341/24 |
| 4,694,280 | 9/1987 | Rollhaus et al. | 400/100 |
| 4,701,130 | 10/1987 | Whitney et al. | 434/118 |
| 4,891,786 | 1/1990 | Goldwasser | 364/419 |
| 4,937,778 | 6/1990 | Wolf et al. | 340/711 |

*Primary Examiner*—Thomas C. Lee
*Assistant Examiner*—Meng-Ai T. An
*Attorney, Agent, or Firm*—Christensen, O'Connor, Johnson & Kindness

[57] ABSTRACT

A method and apparatus for enhancing the operation of computer keyboards. The keyboard includes a plurality of keys, and code generation means for producing make and break codes when keys are depressed and released. The invention comprises a processor coupled to receive the generated codes. The processor detects a sequence of codes serially including a make code of a trigger key, a make code of a target key different from the trigger key, and a break code of the target key. A timer determines whether the interval of time between the trigger key make code and the target key break codes exceeds a predetermined non-zero triggering interval. If the sequence is not detected, or if the triggering interval is not exceeded, then the processor outputs the codes produced by the code generation means. However if the sequence is detected and if the triggering interval is exceeded, modified codes are output. Embodiments are described in which non-touch-type keys, such as the control key, can be typed using only the touch-type portion of a keyboard.

24 Claims, 9 Drawing Sheets

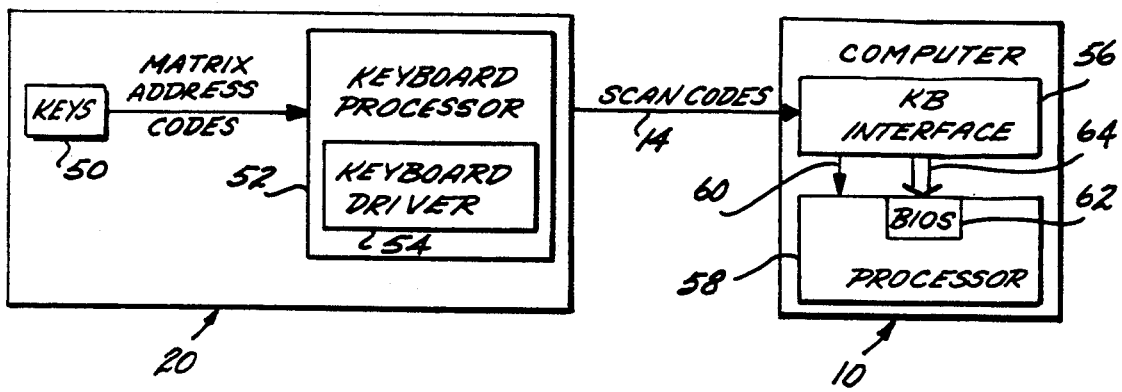
Fig. 3.
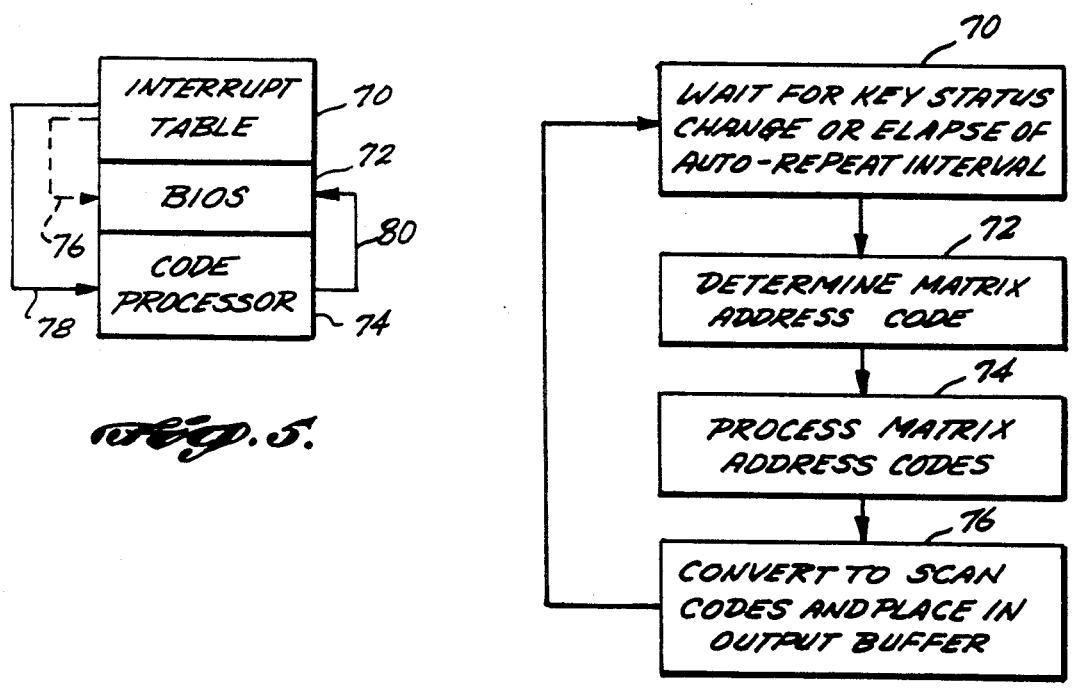
Fig. 5.
Fig. 4.

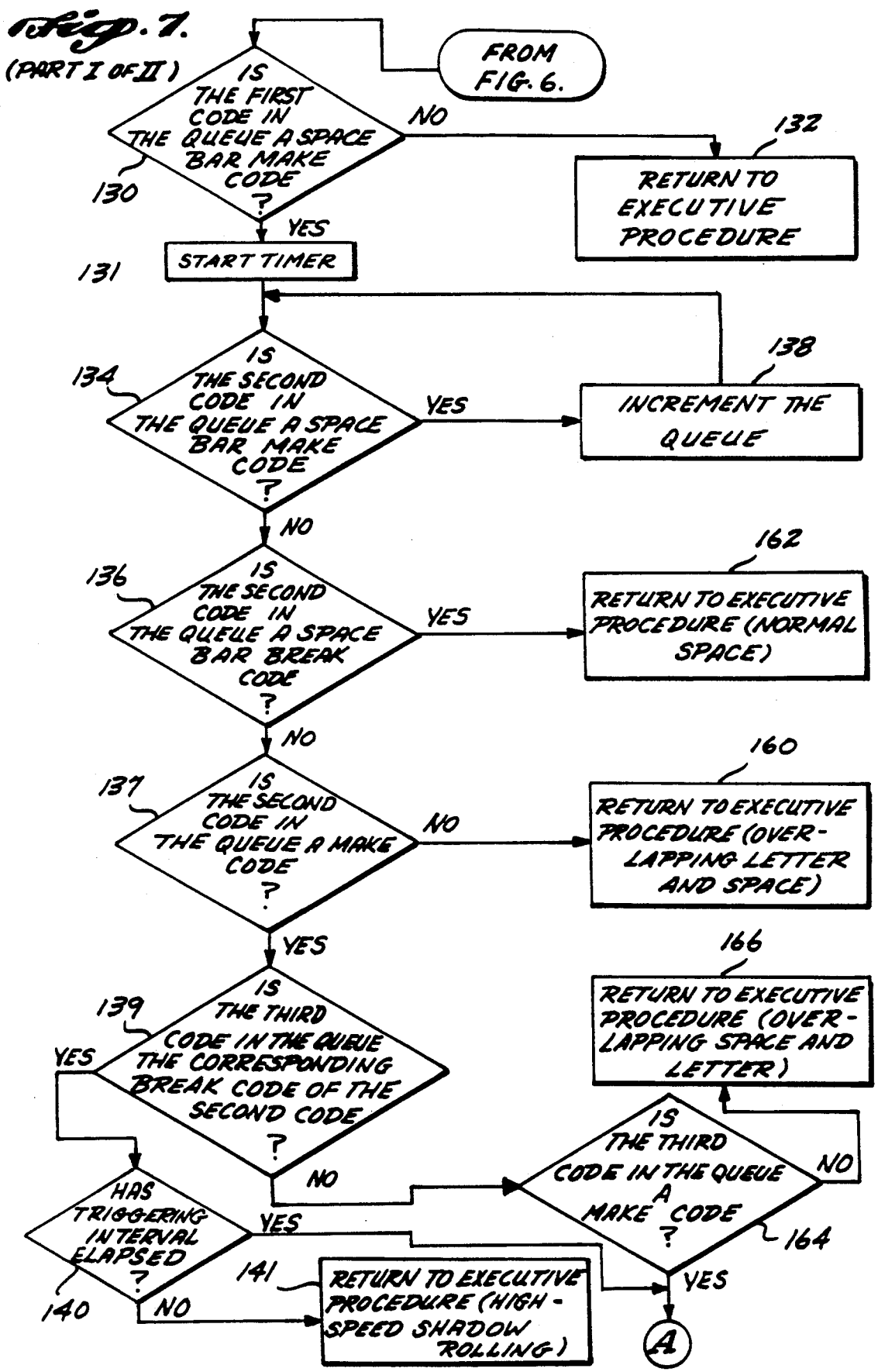

(PART II OF II)

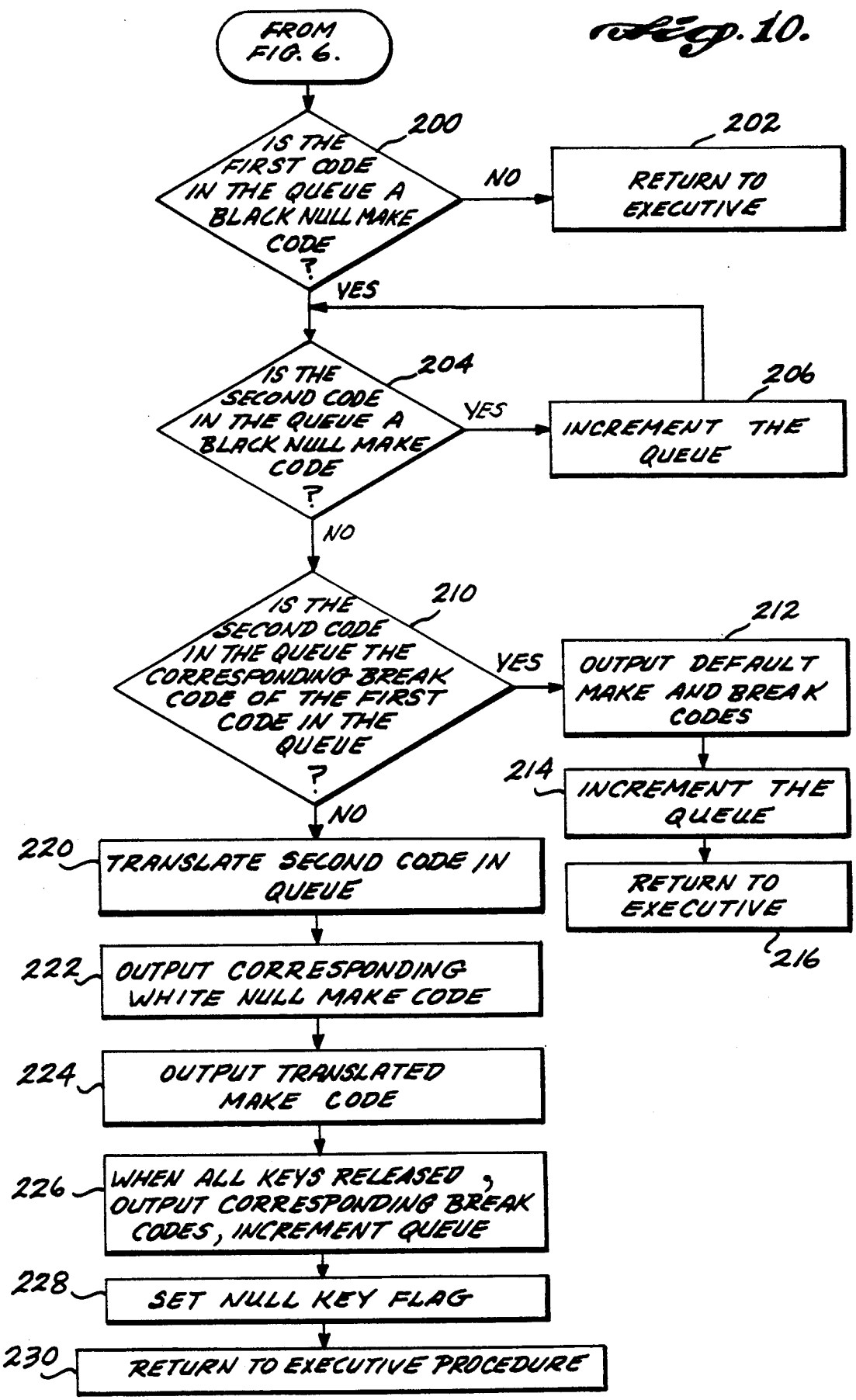

SYSTEM FOR SELECTIVELY MODIFYING CODES GENERATED BY A TOUCH TYPE KEYBOARD UPON DETECTING PREDETERMINED SEQUENCE OF MAKE/BREAK CODES AND EXPIRATION OF PREDEFINED TIME INTERVAL

REFERENCE TO RELATED APPLICATIONS

This application is a continuation-in-part of U.S. patent application Ser. No. 853,302, filed Apr. 14, 1986 now Pat. No. 4,937,778.

FIELD OF THE INVENTION

The invention relates to keyboards, and in particular to computer keyboards having keys in addition to the standard touch-type keys.

BACKGROUND OF THE INVENTION

Conventional typewriter keyboards were originally designed with the so-called QWERTY key layout, incorporating the letters of the alphabet (A-Z) and four punctuation symbols (, . ; /). These keys were arranged in three rows, each row having ten keys. The letters were arranged on the keys so as to minimize the possibility of mechanical arms striking one another when frequently used keys were typed. At a later date, number keys (0-9) were added in a fourth row above the letter and punctuation keys. This keyboard eventually became known as the Universal Keyboard. With the addition of a space bar beneath the lowest row of keys, the Universal Keyboard comprised the typical keyboard for which typing manuals were devised to allow speed typing by touch.

Typists trained on the Universal Keyboard can achieve extremely high typing speeds by touch-typing memorized keystrokes. Because the keys are spaced in a small group, the position of the hands need not be changed, and high typing speeds can be maintained.

The rapid growth of small and mid-sized computers, supplemented by word processing programs, has largely replaced the conventional typewriter in the modern office. Typical keyboards for such computers have many non-touch-type keys in addition to the original touch-type keys of the Universal Keyboard. For example, one very popular type of personal computer has 101 keys. The touch-type keys are positioned in a group in the center of the keyboard. To the immediate left of this group are the Control key, Shift key, Alternate key, and Caps Lock key. To the immediate right of the touch-type keys are the Enter key, a Shift key, and a duplicate set of Control and Alternate keys. Further to the right are a set of cursor movement keys, editing keys, and a numeric keypad. To the left of the universal keyboard area is a two-column-by-five-row array of function keys (F1-F10).

These additional non-touch-type keys are necessary for proper operation and full utilization of the various features of modern computers. However these keys greatly reduce the speed with which computers can be operated, because the positions of these additional keys force the typist to break his or her touch-type routine, and slow to a greatly reduced typing speed. For example, to execute the command "Control-p", the left hand must be lifted away from the letter keys in order to hold down the Control key while the 'p' key is typed with the right hand. Thus, the Control key, one of the most frequently used keys on the keyboard, is impossible to touch-type.

Many computers utilize a keyboard that is physically separate from the computer, and is connected thereto by a cable that includes a clock line and a data line. Pressing a key on the keyboard generates an eight-bit "make" code which is transmitted serially over the data line to the computer. Releasing the key generates a corresponding eight-bit "break" code which is sent over the data line after the make code. The clock line synchronizes the transmission of the make and break codes with the computer's on-board clock. The keyboard sends a data bit, and the computer reads the bit sent, every time the clock line goes low. In this way, the data is transmitted synchronously with the computer clock.

The first seven digits of the make or break code identifies the key which has been pressed or released. The eighth (most significant) bit of the code indicates whether the key is pressed (a make code) or released (a break code). For example, the letter A on the keyboard is represented by the seven bits 0011110. The eighth and most significant bit is '0' if the code is a make code, or '1' if the code is a break code. The computer holds the data line low while a data word is processed, and only allows the data line to go high when it is ready to receive another eight-bit word.

The computer usually generates a character on its display (such as a CRT screen) when a make code is received. The break codes only come into play when the "null" keys, such as the Control, Alternate, or Shift keys are used. These null keys do not generate a character or space when pressed, but only cause the computer to perform a function if the make code of such a key is immediately followed by the make code of a different key. For example, if the Control key make code is immediately followed by the Control key break code (i.e. the Control key is simply pressed and released), no discernable operation takes place. However, if the 't' key is pressed while the Control key is held down (Control key make code, followed by 't' key make code) then the computer will perform the "Control-t" command.

The use of make and break codes in keyboards of this type has made it possible in the present invention to make touch-type keys, such as the space bar and letter keys, perform the functions of the non-touch-type keys, by monitoring the sequence in which the keys are pressed and released.

SUMMARY OF THE INVENTION

The present invention provides an enhancement for computer keyboards that permits non-touch-type keystrokes to be entered using only touch-type keys. As a result, a trained typist can achieve a high typing speed, even when non-touch-type keys are used.

The present invention is used in a keyboard that includes a plurality of keys, and code generation means for producing a make code when a key is depressed and a break code when a key is released. The invention comprises processing means coupled to receive the codes produced by the code generation means. The processing means includes detection means for detecting a sequence of codes, serially including a make code of a trigger key, a make code of a target key different from the trigger key, and a break code of the target key. Timing means are provided for determining whether the interval of time between the trigger key make code and the target key break code exceeds a predetermined nonzero triggering interval. If the sequence is detected, and if the triggering interval is exceeded, then modified codes are output by the processing means.

In one embodiment, the trigger key is the space bar key, and the target key is any other touch-type key. In this embodiment, the detection means looks for the sequence: space bar make code; touch-type key make code; and the break code of the same touch-type key. When the sequence is detected, and when the interval of time between the space bar make code and the touch-type break code exceeds the triggering interval, then the processing means outputs a control key make code followed by the make and break codes of the touch-type key. As a result, control commands can be generated by the typist using only touch-type keys. In a second embodiment, the trigger is a predetermined touch-type key, such as the 'f' key or the 'j' key, and the target key is a touch-type key on the opposite side of the keyboard with respect to the trigger key. In this case, when the sequence is detected and the triggering interval is exceeded, the processing means outputs the make and break codes of a non-touch-type key. This feature therefore permits a large number of non-touch-type keys to be typed using only the touch-type portion of the keyboard.

The requirement that the triggering interval be exceeded prevents accidental actuation of the invention, known as "shadow rolling." Shadow rolling is defined as the sequence of keystrokes when one key is pressed, followed by a second key that is pressed and released, followed by the release of the first key. Shadow rolling can inadvertently take place during normal, high-speed touch-typing. However it has been discovered that shadow rolling almost always takes place in less than about 130 milliseconds. On the other hand, the triggering keystroke sequence, consisting of a trigger key depression, followed by a target key depression and release, normally requires more than 200 milliseconds to deliberately execute, and is almost impossible to deliberately execute in less than about 170 milliseconds. Thus a suitable triggering interval, such as 150 milliseconds, will effectively prevent shadow rolling from accidentally activating the invention, but will not hinder deliberate activation of the invention.

In a further embodiment, the present invention provides a means to assign dual functions or characters to a key, and in addition means to enable both of those such functions to be incorporated into null key sequences.

BRIEF DESCRIPTION OF THE DRAWINGS

FIG. 3 is a block diagram of a keyboard coupled to a computer;

FIG. 4 is a block diagram of a keyboard driver including the code processing feature of the present invention;

FIG. 5 is a simplified memory map for the computer processor;

FIG. 10 is a logic flow diagram for a preferred embodiment of the dual null key procedure.

DETAILED DESCRIPTION OF THE PREFERRED EMBODIMENT

Figure 1:
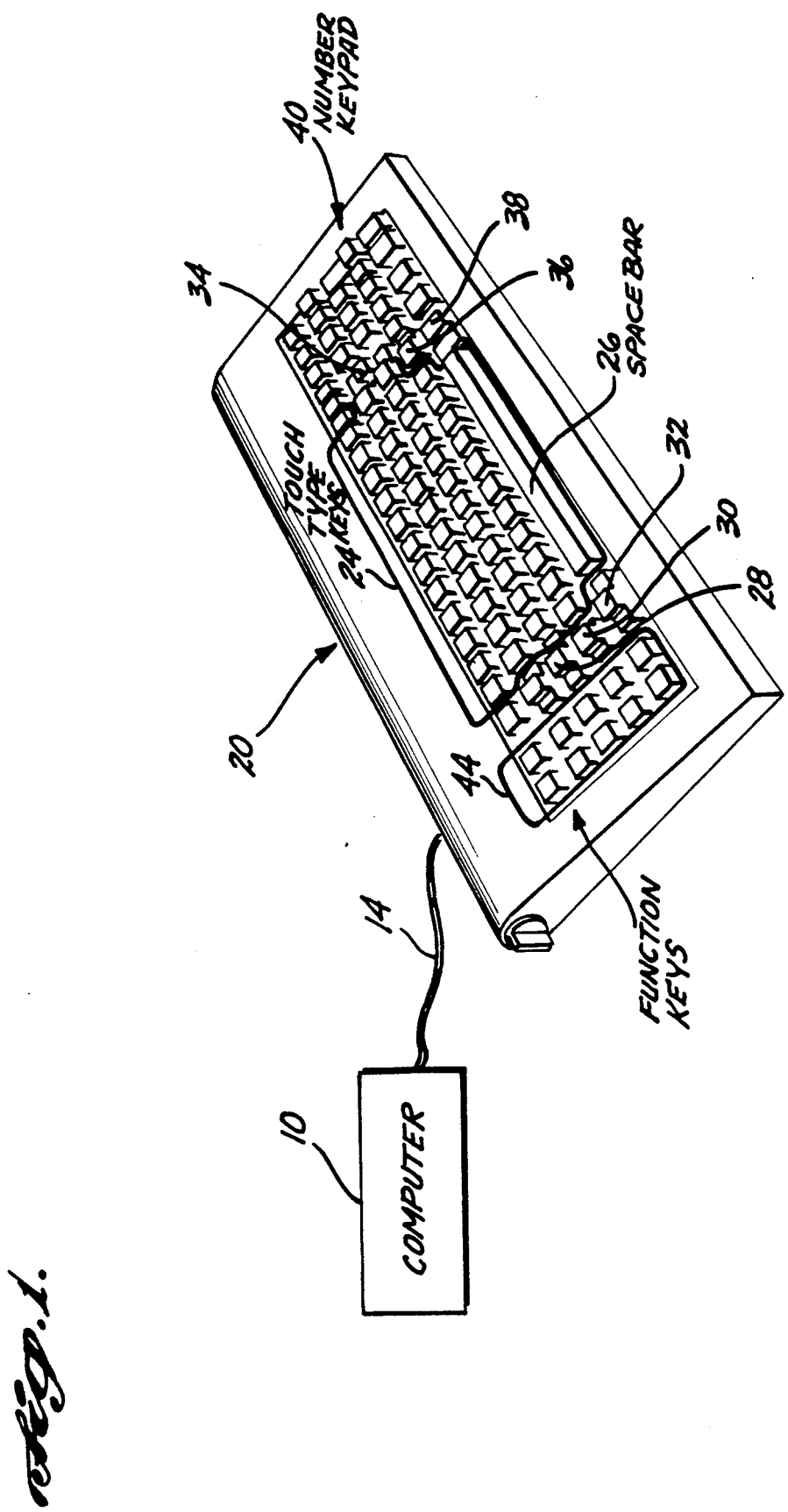
FIG. 1 is an isometric view of a keyboard having touch-type and non-touch-type keys.

FIG. 1 illustrates a computer 10 having a keyboard 20 that is connected to the computer via cable 14. The keyboard 20 is of the type which contains touch-type keys generally indicated by area 24, including space bar 26. The touch-type keys correspond to what is commonly known as the Universal Keyboard, and include the letters of the alphabet, four punctuation symbols, the space bar, and numbers 0-9 on the top row of area 24.

Keyboard 20 includes additional non-touch-type keys which are outside of area 24. These keys include Control key 28, Shift key 30, and Alternate key 32 to the left of the touch-type key area 24. These three keys are collectively referred to as null keys. To the right, and adjacent to the touch-type area, is an Enter key 34, another Shift key 36, and Shift-Lock key 38. There are additional non-touch-type keys to the far right of touch-type area 24, including cursor movement keys, editing keys, and a numeric keypad 40. To the far left of the touch-type key area 24 is a two-column-by-five-row array 44 of function keys (F1-F10), which controls various functions of the computer 10. It will be understood that the key arrangement shown in FIG. 1 is but one example of the many keyboard arrangements in use on computers, and that the present invention applies to any keyboard having both touch-type and non-touch-type keys.

The keyboard 20 is of the type which generates a make code for every downstroke of a key, and a break code for every upstroke of a key. Make and break codes are referred to collectively herein as scan codes. In addition, the keyboard has an autorepeat feature which automatically generates additional make codes if a key is held down for a predetermined period. In general, computer 10 includes a display, and pressing a key in the touch-type key area 24 generates a character on the computer display when the key make code is received by the computer. The break codes for the touch-type keys generally are not utilized by the computer. The null keys are special keys in that they perform no function unless they are held down while another key is pressed. For example, pressing and releasing of the Control key 28 is interpreted by the computer as a non-function. However, if the Control key is held down while the letter 'p' is pressed, the computer interprets this series as a request for the "Control-p" command.

In one preferred embodiment, referred to herein as the space bar control key feature, the present invention allows the typist to touch-type the Control key 28 using the space bar 26, if a specific triggering sequence of make and break codes is generated by the typist, and if the time duration of the sequence exceeds a predetermined triggering interval, such as 150 milliseconds. In this way, the space bar 26 performs a second function in addition to its dedicated function of typing ordinary spaces. For example, in order to activate the "Control-t" function using the enhanced keyboard system provided by the present invention, the typist holds down the space bar and, while holding down the space bar, presses and releases the 't' key. Assuming that the time interval between the depression of the space bar and the release of the 't' key exceeds the triggering interval, the enhanced keyboard system recognizes this sequence (space bar make code followed by the 't' key make and break codes) as an indication that the operator desires a "Control-t" command. The enhanced keyboard system responds by generating a Control key make code, followed by a 't' key make code and a 't' key break code. In this example, in the terminology used herein, the space bar is referred to as the "trigger" key, and the 't' key is referred to as the "target" key. Note that the enhanced keyboard system does not generate the modified codes until the 't' key is released.

The purpose of requiring the triggering sequence to exceed a predetermined triggering interval is to distinguish deliberate use of the space bar control key feature from the phenomenon of high-speed shadow rolling described above. In particular, it has been found that a high-speed typist will occasionally produce the above-described triggering sequence when typing a space key followed by the letter 't'. However, when this sequence is inadvertently produced during normal high-speed typing, it has been found that the time interval between the space bar make code and the letter key break code most typically falls in the range of 50-130 milliseconds. On the other hand, it has been found that even a trained typist requires about 170 milliseconds or more to deliberately actuate the triggering sequence. For these reasons, the most preferred triggering interval is about 150 milliseconds, and a preferred triggering interval range is 130-170 milliseconds. Most broadly, the triggering interval feature of the invention will produce some benefits with any non-zero triggering interval up to 500 milliseconds, the autorepeating interval for most keyboards.

The enhanced keyboard system preferably also recognizes the sequence of a space bar make code, followed by multiple 't' key make codes, as an indication that the operator desires a repeating "Control-t" command. Accordingly, the enhanced keyboard system generates a Control key make code, followed by multiple 't' key make codes. This allows the operator to utilize the autorepeating key feature of the keyboard. The modified codes are not generated until the 't' key begins autorepeating. In this case, the triggering interval test is not needed, because the autorepeating interval exceeds the longest triggering interval.

Although a conscious effort is required to activate the Space Bar Control Key feature as described, far less effort and time is required than when utilizing the non-touch-type Control key 28. The Space Bar Control Key feature of the present invention does not suffer from the inherent distance limitation to which the non-touch-type keys are subject, because of their distance from the ordinary touch typing hands positions. Therefore, once an operator has learned the Space Bar Control Key feature of the present invention, greatly increased typing speeds can be achieved while using much less effort.

Figure 2:
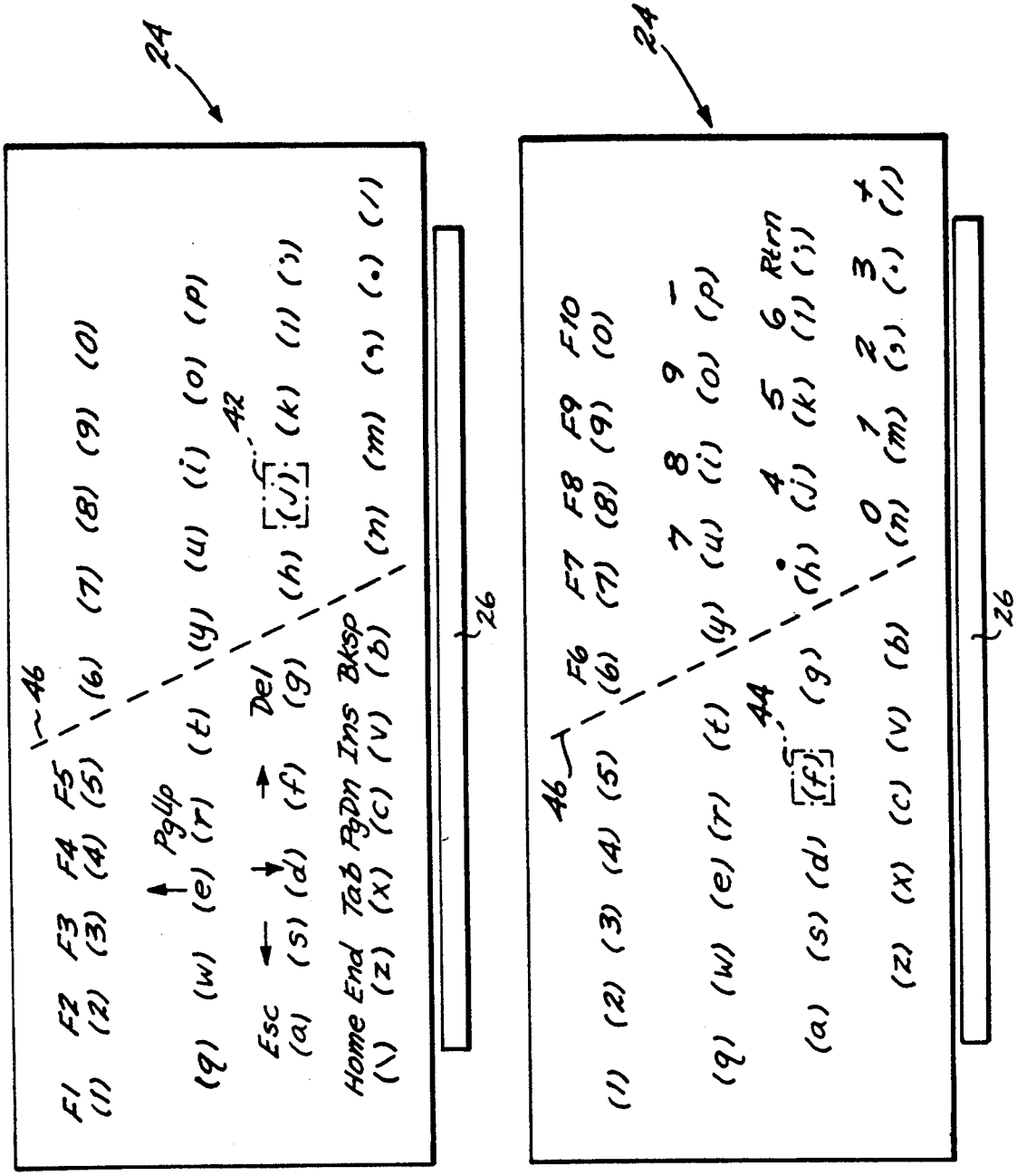
FIGS. 2a and 2b are schematic representations of the touch-type keys on the keyboard, showing the non-touch-type functions that can be keyed, utilizing the 'f' and 'j' keys as trigger keys.

FIGS. 2a and 2b illustrate the Function Keyboard feature of the present invention, which allows the typist to touch-type all of the non-touch-type keys, including the Enter key 34, all of the keys in the non-touch-type area 40, and function keys (F1-F10) 44. The letters and numbers (in parentheses) shown in FIGS. 2a and 2b represent the letters and numbers of the touch-type keys on a Universal Keyboard. The superscript symbols above each key represent the functions of the non-touch-type keys of a typical keyboard. In this feature of the invention, two trigger keys, the 'j' key 40 and the 'f' key 44, are provided. When the 'j' key 42 is used as a trigger key, all of the superscript functions shown to the left of line 46 may be typed by depressing and releasing the corresponding target key while the 'j' key remains depressed, provided that the time interval between the depression of the trigger key and the release of the target key exceeds the triggering interval. Preferably, the triggering interval for the function keyboard feature is the same as the triggering interval for the space bar control key feature, although different triggering intervals could of course be used. Similarly, as shown in FIG. 2b, when 'f' key 44 is used as a trigger key, the superscript functions on the keys to the right of line 46 can be accessed. In both cases, while one hand holds down the trigger key, the other hand is free to depress and release the desired target key.

For the Function Keyboard feature, when the described key sequence is detected and when the duration of the key sequence exceeds the triggering interval, the enhanced keyboard system translates the make and break codes of the target key into the associated make and break codes of the key indicated by the superscript above the target key. The enhanced keyboard system also operates in this manner if the target key is held down until autorepeating begins, and before the trigger key is released. However, unlike the Space Bar Control key feature, the trigger key make and break codes are not translated at all, so that the computer only receives the translated touch-type target key codes as if the conventional non-touch-type key, indicated by the superscript, had actually been typed. The translated target key codes are not produced until the target key is released, or until autorepeating begins. As previously described for the Space Bar Control key feature, inclusion of the triggering interval requirement prevents inadvertent operation of the Function Keyboard feature when high-speed typists overlap typing of the touch-type keys.

The preferred embodiment of the enhanced keyboard system, as described above, allows a typist to touch-type all of the keys which previously were unavailable for touch typing. Furthermore, the need for keys away from the touch-type key area 24 is eliminated, and keyboards may be manufactured without such keys, at a reduced cost.

FIG. 3 presents a basic block diagram of keyboard 20 connected to computer 10 by cable 14. Keyboard 20 includes the keys 50 that are pressed and released by an operator, and a keyboard processor 52. The keyboard processor operates under the control of keyboard driver program 54. In general, each key comprises an on-off switch, and keyboard driver 54 causes the keyboard processor to scan the key switches in a matrix (row and column) format, thereby generating matrix address codes when a given key is pressed, released, or held down for a predetermined time period (autorepeating). The keyboard driver then translates the matrix address codes into scan codes, i.e., into make and break codes as described above. The scan codes are transmitted to computer 10 via cable 14 in a format that is synchronized with the computer's clock. At the computer, the scan codes are received by keyboard interface 56, and converted from serial to parallel form. When a complete scan code has been received, the keyboard interface interrupts processor 58 via line 60, causing BIOS routine 62 operating in processor 58 to read the scan code via bus 64. Generally, BIOS routine 62 translates scan codes into ASCII codes for use by other programs running on processor 58.

As previously described, the present invention provides code processing means for processing make or break codes, or their equivalents, and for modifying such codes when certain predefined conditions are detected. The processing means of the invention can operate at any point in the data transfer outlined in FIG. 3, so long as the individual make or break codes or their equivalents are still available for processing.

In a first embodiment, the processing means of the present invention is implemented in a separate microprocessor, or equivalent hardware, connected between keyboard processor 52 and keyboard interface 56. This separate processor can be housed in a separate unit, or physically housed within keyboard 20 or computer 10. Further details concerning this embodiment are set forth in U.S. patent application entitled "Keyboard Enhancer," Ser. No. 853,302, filed Apr. 14, 1986, herein expressly incorporated by reference.

In a second preferred embodiment, the processing means of the present invention is incorporated into keyboard processor 52, and essentially forms a portion of keyboard driver 54. FIG. 4 presents a block diagram of a keyboard driver program that includes the enhanced keyboard system of the present invention. The keyboard driver waits at block 70 for a change in the status of any key (i.e., key press or key release), or for the elapse of an autorepeating interval when a key is depressed. When one of these events occurs, block 72 proceeds to determine the appropriate matrix address code. The matrix address code identifies the key, and indicates whether or not the key has just been pressed, just been released, or whether the autorepeating interval has elapsed with the key pressed.

At this point, the keyboard driver would normally proceed to block 76, to convert the matrix address code to the appropriate scan code, i.e., the matrix address code would be converted to a make code in the first and third cases discussed above, and into a break code for the second case discussed above. However, in accordance with a preferred embodiment of the invention, block 74 first processes the matrix address codes in accordance with the techniques described above for the Space Bar Control Key feature and the Function Keyboard feature, which techniques are also described in greater detail below. If the described sequences are found and the triggering interval test is met, then the matrix address codes are modified accordingly. Otherwise, the matrix address codes are unchanged. In either case, the resulting matrix address codes are then passed to block 76, where they are converted into the appropriate scan codes. The scan codes are placed in the output buffer of the keyboard processor, and the keyboard processor returns to block 70 to wait for the next status change or time interval elapse. In order to provide consistent terminology, matrix codes indicating that a key has just been depressed, or that a key has been held down for the autorepeating interval, will be referred to as make codes, while matrix address codes indicating that a key has been released will be referred to as break codes.

It will be appreciated that the processing called for by the present invention could also be carried in block 76, i.e., on the scan codes rather than on the matrix address codes. However, processing of the matrix address codes is preferred, because matrix address codes are less variable from one type of computer system to another.

In a third preferred embodiment, the code processing called for by the present invention is carried out by processor 58 of computer 10. Implementation of the code processing within processor 58 is illustrated in schematic form in FIG. 5. In particular, FIG. 5 illustrates a portion of the memory space of processor 58. This memory space includes interrupt table 70, BIOS 72, and code processor 74 provided by the present invention. In normal operation, when an interrupt is received by processor 58 from keyboard interface 56, interrupt table 70 directs control to BIOS routine 72, as symbolized by dashed line 76. However, when the present invention is installed, interrupts table 70 is modified so as to point to code processor 74, as illustrated by line 78. Thus, when a scan code is ready to be received from the keyboard interface, control is passed to code processor 74, and the code processor accumulates the received scan codes, and processes them in accordance with the present invention. When code processor 74 is ready to output a scan code, it does so by calling BIOS 72 as symbolized by line 80. Code processor 74 can be implemented as part of a user application program, as part of the operating system software, or as a terminate and stay resident (TSR) program within computer 10.

Figure 6:
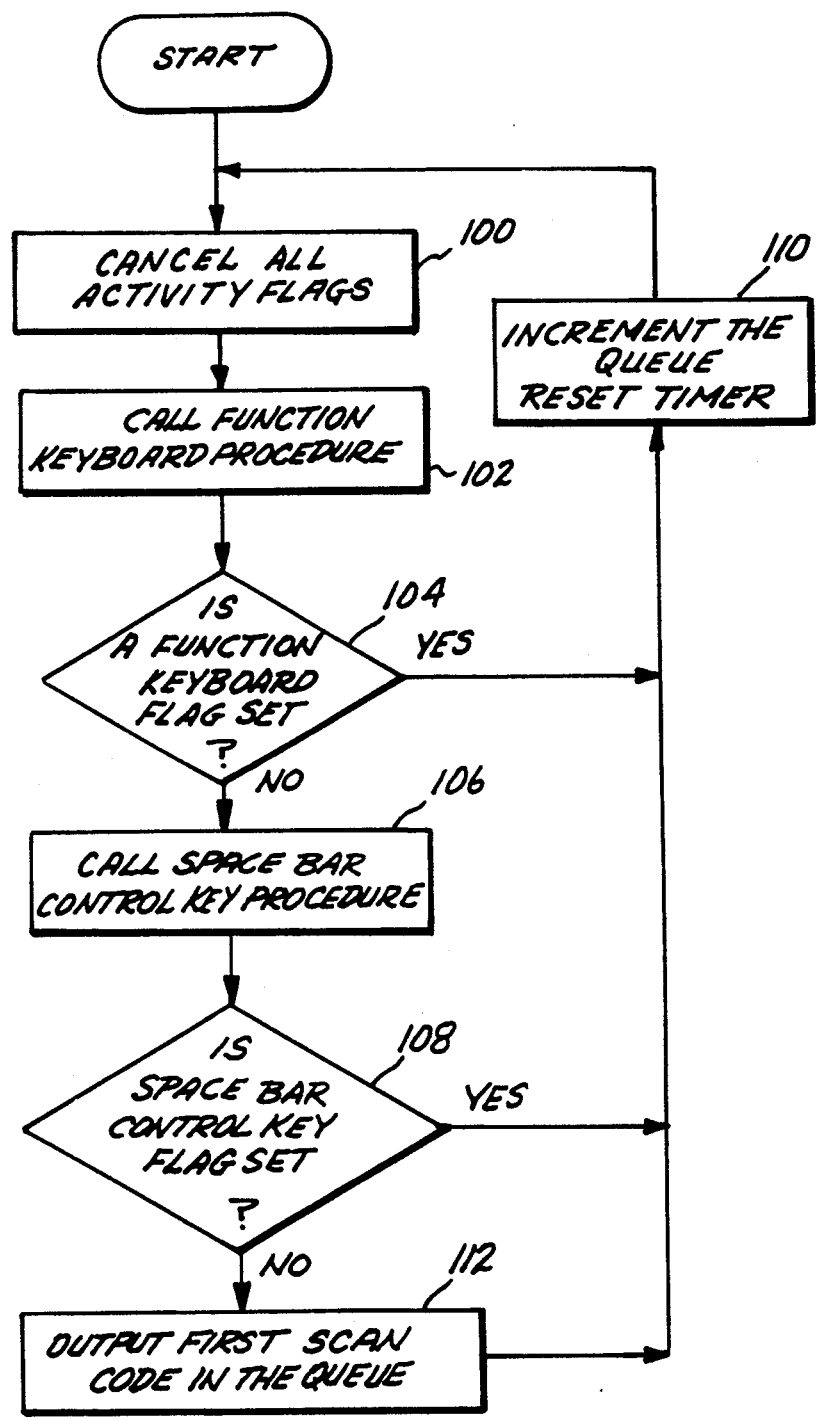
FIG. 6 is a logic diagram for an executive procedure for a computer program embodying the present invention.
Figure 7:
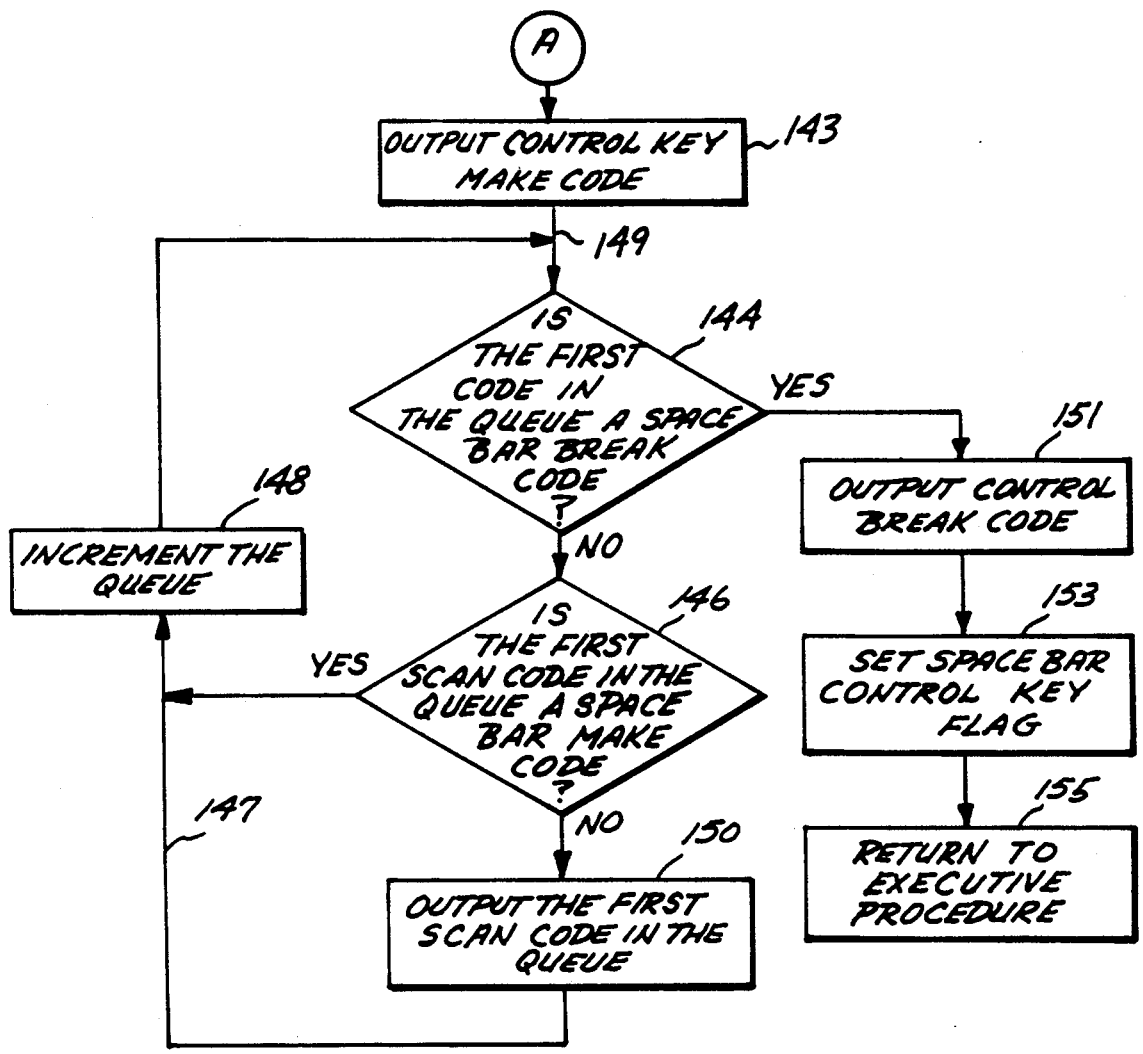
FIG. 7 comprises a logic flow diagram for a Space Bar Control Key subroutine of the present invention.

The logical steps carried out by the code processor of the present invention are essentially unchanged regardless of the particular method of implementation. One preferred embodiment of the invention is illustrated in FIGS. 6 and 7. FIG. 6 illustrates an executive routine for integrating the activity of the Space Bar Control Key feature (FIG. 7), and the Function Keyboard feature. In the description of these figures, the term "code" will be used to designate as scan codes or matrix address codes, depending upon the particular implementation approach used. In all cases, it is assumed that the processor executing the illustrated steps has available to it a portion of random access memory (RAM) for receiving the scan or matrix address codes to be processed. This section of RAM will be referred to as a queue, and it will be assumed that the queue is operated as a first-in, first-out memory buffer.

Once the loading of the queue with codes has begun, the code processor begins processing the codes in the queue. The executive procedure, in step 100, first cancels any activity flags which may have been set by procedures to be described below, and then calls a Function Keyboard procedure subroutine at step 102. If the code sequence and timing requirements for the Function Keyboard feature (as described above) are detected by the Function Keyboard procedure, then the Function Keyboard procedure outputs the modified codes and sets a Function Keyboard flag, and step 104 branches to step 110 to increment the queue and reset the interval timer. Program flow then returns to block 100. The interval timer is the timer used to determine if the triggering interval has been exceeded, as described below.

If the triggering sequence for the Function Keyboard feature has not been detected, then the Space Bar Control Key procedure will be called at block 106. If the appropriate key sequence and timing requirements for the Space Bar Control Key feature (as described above) are detected, then the Space Bar Control Key procedure will output the modified codes and set a Space Bar Control Key flag. The setting of this flag will be detected by branch 108, and the program will jump to block 110 to reset the timer and increment the queue. If, however, the Space Bar Control Key flag is not set, then the first code in the queue will be sent to the computer, as shown in block 112, after which block 110 will be executed.

From the above, it is apparent that when a typist is typing normal letters, spaces, or functions, whether touch-type or non-touch-type, then the codes received by the code processor will be forwarded without modification, as indicated in step 112, so long as the described key sequence and timing requirements are not detected. However, if the sequences and timing for such requirements are detected, then the corresponding procedure will output modified codes. For the Space Bar Control key procedure, the modification will consist of substituting a Control Key make code for a Space Bar make code. For the function keyboard procedure, the trigger key make code will be eliminated, and the target key make and break codes will be translated into make and break codes for the corresponding non-touch-type keys, as indicated in FIGS. 2a and 2b. For this procedure, the translated codes can be stored in a conventional look-up table.

For the purpose of clarity, and to enable those skilled in the art to make and use the invention, this description will continue with an example which illustrates the logic flow of the executive procedure and the Space Bar Control Key procedure. Assume that the typist wishes to send a "Control-t" command sequence to the computer 10. While holding down the space bar, the typist presses and releases the 't' key, then releases the space bar. This will produce the following code sequence: space bar make code; 't' key make code; 't' key break code; and space bar break code. As previously described, the time interval between the space bar make code and the 't' key break code will exceed the triggering interval, even when performed by a fast typist. The executive procedure will begin processing codes as soon as the space bar make code is received in the queue. Once any pending activity flags are canceled by activity step 100, the Function Keyboard procedure is entered. The function keyboard procedure determines whether the first code in the queue is an 'f' or 'j' key make code. Since the first code in the queue is a space bar make code, the Function Keyboard procedure returns control to the executive procedure without modifying the queue, outputting any codes, or setting the Function Keyboard flag. The executive procedure then checks in step 104 to see whether a function keyboard flag has been set. Since one has not been set, step 106 calls the Space Bar Control Key procedure shown in FIG. 7.

The Space Bar Control Key procedure begins in step 130 by determining whether the first code in the queue is a space bar make code. Since in this example the first code is a space bar make code, processing proceeds to step 131. If the first code was something other than a space bar make code, this would be an indication that normal typing was occurring, and the logic flow would return to the Executive Procedure through step 132.

Step 131 starts the interval timer that will be used to compare the duration of the triggering key sequence to the triggering interval, as further described below. The program next looks at the second code in the queue in step 134. If a second code has not yet been received into the queue, then the processing waits at block 134 until the second code is received. Once the second code ('t' make code) is received, it is determined that the second code is not a space bar make code, and the logic flow enters step 136. Had the second code been a space bar make code, the queue would have been incremented according to step 138, and the logic flow would repeat at step 131. The purpose of this loop is to eliminate additional, autorepeating space bar make codes, once it has been determined by step 130 that the first code is a space bar make code. It has been found to be desirable to eliminate these extra codes in order to simplify the logic required to determine whether a triggering sequence exists.

Step 136 checks to see if the second code in the queue is a space bar break code. If so, then a normal space has been typed, and control is returned to the executive procedure, without setting the space bar control key flag or outputting any codes. However, in the present example, the second code in the queue is not a space bar break code, step 136 is failed, and step 137 then checks to see if the second code in the queue is a make code. If not, then an overlapping letter and space have been typed, and control is returned to the executive procedure in block 160. However in the present example, the second code in the queue is the 't' key make code, step 139 is entered, and the third code in the queue is examined. If the third code has not yet been received, then the processing waits at block 139 until a third code has been received. Block 139 checks to see if the third code is the corresponding break code of the second code in the queue. Because the third code in the queue (the 't' key break code) is the corresponding break code of the second code in the queue (the 't' key make code), this test is passed, and step 140 determines whether the triggering interval (e.g., 150 milliseconds) has elapsed. In particular, step 140 determines the time interval from step 131 to step 140, and compares this elapsed time with the triggering interval. If the elapsed time is less than the triggering interval, then step 141 returns control to the executive procedure. This case corresponds to high-speed shadow rolling, as described above. If step 140 determines that the elapsed time equals or exceeds the triggering interval, then step 143 (FIG. 7, part II) is entered, which step causes a Control key make code to be output. At this point, the Space Bar Control Key procedure has detected the combination of the key sequence and timing that indicates that the typist is requesting a Control code, rather than an ordinary space.

The next step 144 looks at the first code in the queue to determine if it is a space bar break code. Because the first code is a space bar make code, this test is failed, and step 146 is entered. Because the first code in the queue is a space bar make code, step 146 is passed, and the queue is incremented according to step 148. Incrementing the queue causes the first code in the queue to be eliminated, and causes all other codes to move up one position. Thus after step 148, the queue contains the following codes: 't' key make code; 't' key break code; and space bar break code.

After the queue is incremented, control returns to block 144. Because the first code in the queue is still not a space bar break code, step 146 is re-entered. However during this iteration, step 146 fails because the first code in the queue is not a space bar make code, but a 't' key make code. Therefore step 150 is executed, and the first code in the queue (the 't' key make code) is output. The queue is then incremented again in block 148, and control again returns to block 144. During this iteration, steps 144 and 146 will again be failed, and the 't' key break code will be sent to the computer by step 150. After the queue is again incremented, only the space bar break code will remain in the queue, and step 144 will be passed. Therefore, steps 151, 153, and 155 will be executed, the Control key break code will be output, the Space Bar Control Key flag will be set, and control will return to the executive procedure. Upon returning to the executive procedure, note that step 108 will be passed because the Space Bar Control Key flag has been set. The queue is again incremented by step 110, leaving the queue empty, and program flow commands again at block 100.

Returning to FIG. 7, part I, note that if the third code in the queue is not the break code corresponding to the second code in the queue, step 139 is failed, and test 164 is performed. First, consider the situation in which the typists types the space bar followed by the 'r' key, overlapping the keys such that the key sequence is space bar make key, 'r' key make code, space bar break code, 'r' key break code. In this case, the test in block 164 will fail, since the third code in the queue is the space bar break code. Block 166 will then return control to the executive procedure. However, if both the space bar and 'r' key are held down until autorepeating commences, the third code in the queue will be a make code, and processing will resume with block 143, as in the example detailed above.

The function keyboard procedure called at step 102 in FIG. 6 may be implemented using logic very similar to that shown in FIG. 7 for the Space Bar Control Key procedure. Both procedures detect a sequence of trigger key make code, target key make code and target key break code, in combination with the elapse of the selected triggering interval. In the case of the function keyboard procedure, a look-up table may be used to perform the translations indicated in FIGS. 2A and 2B. Further details concerning the function keyboard procedure may be found in U.S. patent application Ser. No. 853,302, filed Apr. 14, 1986.

Figure 8:
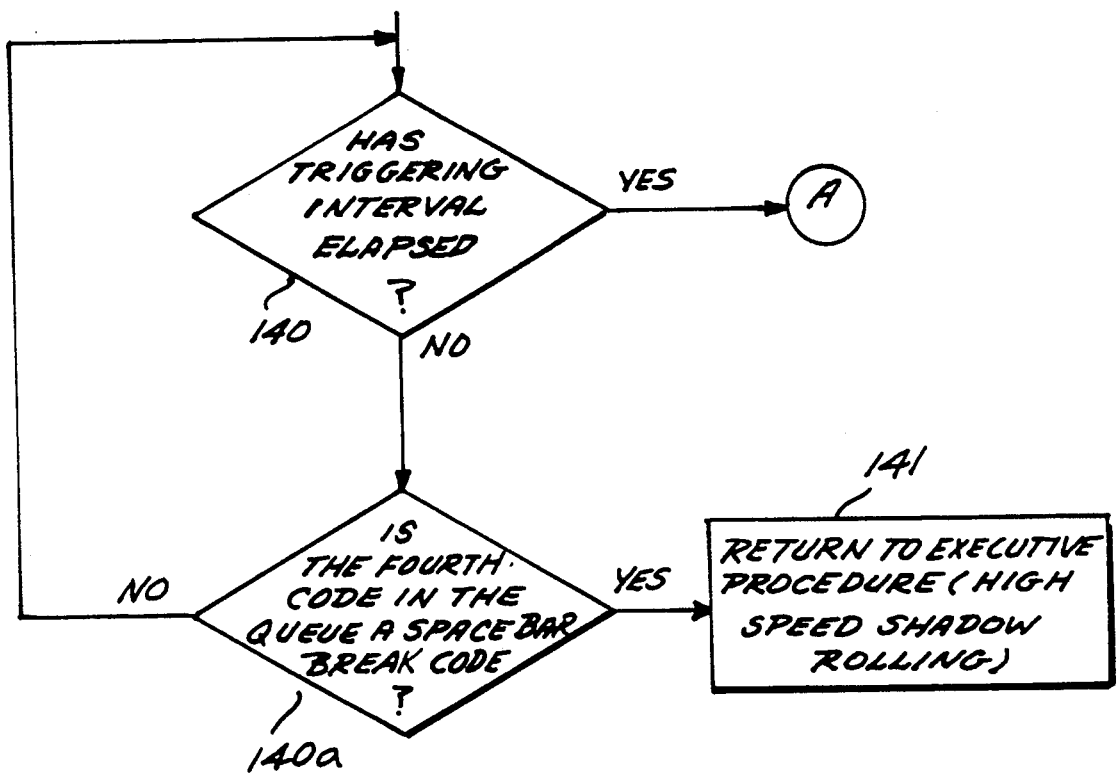
FIG. 8 is a partial flow chart showing an alternate embodiment of the invention.

FIG. 8 partially illustrates an alternate embodiment of the invention in which the predetermined triggering interval is used in a somewhat different manner. In FIG. 8, steps 140 and 141 correspond to similarly numbered steps in FIG. 7, part 1. At this point in the processing, the triggering sequence of trigger key make code, target key make code, and target key break code has been detected. In the embodiment previously described, the elapsed time is determined at this point, and compared to the triggering interval. In the case where the elapsed time is less than the triggering interval, control returns to the executive procedure, and no modified codes are generated. However, in the embodiment of FIG. 8, if the elapsed time is less than the triggering interval, step 140a is performed. Step 140a determines whether the fourth code in the queue is a space bar break code. If so, then the entire four-code sequence beginning with the space bar make code, and ending with the space bar break code, has occurred in a time less than the triggering interval, and control therefore returns to the executive procedure without modifying the code. However, if the fourth code in the queue is not a space bar break code, then the processor executes the loops of steps 140 and 140a until one of these tests is passed. Thus if the triggering interval is exceeded before the space bar break code is received, the code processing of the invention is activated, and modified codes are output. On the other hand, if the space bar break code is received prior to the elapse of the triggering interval, no modified codes are generated, and control returns to the executive procedure.

Figure 9:
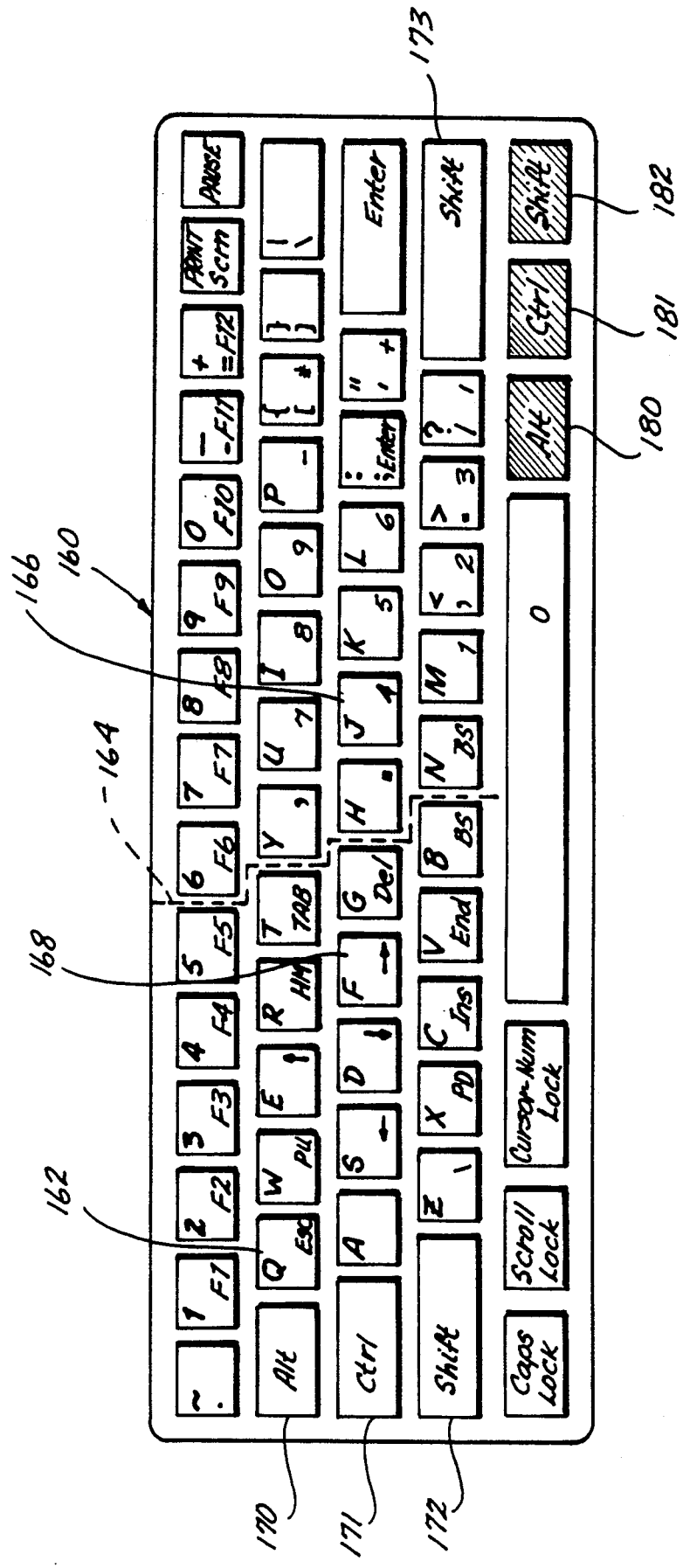
FIG. 9 is a schematic representation of a keyboard using the dual null key feature.

FIG. 9 illustrates a computer keyboard 160 of the type that may be used to implement the Function Keyboard feature of the present invention. In keyboard 160, most of the keys in the touch-type area of the keyboard are assigned their normal touch-type letter or other character, such characters being located on the upper and/or left-hand side of each key. For example, key 162 is assigned character Q, in accordance with the normal QWERTY keyboard layout. In addition, most of the touch-type keys have an associated second character or command, shown on the lower right of each key. These second characters and commands will generically be referred to herein as "second functions". For example, for Q key 162, the second function is the Escape (Esc) command. As described above in connection with the keyboards shown in FIGS. 2a and 2b, the second functions for touch-type keys to the left of line 164 can be typed by using 'j' key 166 as a trigger key, while the second functions of the touch-type keys to the right of line 164 can be typed by using 'f' key 168 as a trigger key.

Keyboard 160 of FIG. 9 illustrates a further feature of the present invention. In particular, keyboard 160 includes a set of "white" null keys, comprising white Alt key 170, white control (Ctrl) key 171, and white shift key 172, and a corresponding set of "black" null keys, comprising black Alt key 180, black control key 181, and black shift key 182. For convenience, keyboard 160 also includes a second white shift key 173. A number of present-day computer keyboards include dual null keys, usually one on each side of the touch-type area, to facilitate typing of the null keys. Each of a given pair of null keys will generate different scan codes, but the two scan codes will be treated as equivalent by the BIOS when the scan codes reach the computer. However, in accordance with a preferred implementation of the present invention, the code processing means modifies the scan codes produced by one set of null keys, for example the black null keys, when certain predetermined patterns are detected.

Taking Q key 162 as an example, if an operator wishes to enter the sequence Alt-Q, this would be performed in a conventional manner, holding down the white Alt key, and then pressing the Q key before releasing the Alt key. However, since the compact keyboard of FIG. 9 does not contain a separate Escape key, it would not be possible to enter the sequence Alt-Escape. This limitation is solved by the provision of black null keys 180-182. Thus to enter the Alt-Escape sequence, the operator would hold down black Alt key 180 and then press Q key 162. In this manner, the black null keys access null key sequences using the second functions of the various keys. Using this feature, it is not only possible to employ the Function Keyboard feature to type non-touch-type keys using touch-type keys, but it is also possible to eliminate a large number of the non-touch-type keys without losing functionality. Stated differently, the keyboard shown in FIG. 9 not only permits an operator to enter an Escape command using the 'j' key 166 as a trigger key, but also permits sequences such as Alt-Escape, Control-Escape, and Shift-Escape to be entered using Q key 162, thereby eliminating all need for a separate Escape key. The result is an extremely compact keyboard that is shown in approximately its actual size in FIG. 9.

The keyboard shown in FIG. 9 may be used to implement another feature that further increases typing efficiency. Normally, pressing and releasing a null key produces no discernable operation of the computer. However the code processing means of the present invention may be programmed, as described below, to treat the pressing and release of black control keys 180-182 as requests for specific commonly used operations. For example, pressing and releasing black Alt key 180 could produce a Page up operation, while pressing and releasing black control key 181 could produce a Page down operation. This would provide single key sequences to access these functions, for example in a word processing program.

The dual null key feature of keyboard 160 can be implemented in a manner very similar to that described already for the Space Bar Control key and Function Keyboard feature. Thus, in FIG. 6, a call is added to a dual null key procedure, followed by a test to determine whether a corresponding dual null key flag had been set, exactly as for the two procedures previously described. A flow chart for a preferred embodiment of the dual null key procedure is set forth in FIG. 10. The procedure begins at step 200 by determining whether the first code in the queue is a black null make code. If not, then control is returned to the executive at step 202, without setting a dual null key flag. However, if the first code in the queue is a black null make code, then step 204 examines the second code in the queue to determine if it is also a black null make code. If so, then the queue is incremented in step 206, and step 204 is repeated. This loop eliminates multiple black null make codes caused by autorepeating.

If and when the second code in the queue is not a black null make code, step 210 determines whether the second code in the queue is the break code of the first code in the queue. If so, then this indicates that a black null key has been pressed and released, without intervening key presses. This feature permits the assignment of special functions to individual black null keys, as described above. For example, in a word processing program, black Alt key 180 and black Control key 181 could be used to implement the Page Up and Page Down features, thereby making it unnecessary to use the Function Keyboard feature to access these functions. In effect, when used alone, the black null keys become dedicated function keys. When block 210 determines that a black null key has been pressed and released, block 212 outputs the appropriate dedicated make and break codes, block 214 increments the queue, and block 216 returns control to the executive procedure.

In the case where the second code in the queue is not the break code corresponding to the first code in the queue, control is passed to block 220. Block 220 looks up the second code in the queue in the Function Keyboard look-up table, as described previously in connection with the Function Keyboard feature. Thus, for example, if the second code in the queue was the Q key make code, then block 220 would retrieve the Escape key make code from the table. Steps 222 and 224 then output a white null make code followed by the translated make code. Thus if Alt key 180 is pressed and then Q key 162 is pressed, steps 222 and 224 output the make code corresponding to white Alt key 170, followed by the escape make code.

Step 226 then examines further codes in the queue, and if necessary waits for the receipt of such codes. When the appropriate break codes have been received, indicating that all keys have been released, block 226 outputs the break codes corresponding to the make codes output in steps 222 and 224, and increments the queue. Step 228 then sets the null key flag, and step 230 returns control to the executive procedure. The setting of the null key flag causes the executive to pass control to step 110 without executing step 112, thereby clearing the queue and restarting the main executive loop. The program flow shown in FIG. 10 could be readily extended to cover situations in which two or more black null keys were simultaneously depressed. In addition, additional dedicated functions could also be assigned to different combinations of the black null keys.

From the foregoing, it will be appreciated that other variations of the preferred embodiment herein disclosed are contemplated and considered to be part of the invention. For example, although the logical detection steps for determining the presence of a triggering sequence have been executed as a computer program in a digital microcomputer, execution of the logic in a system utilizing discrete devices is considered to be part of the invention. Further yet, it will be appreciated that the memory means for receiving the keyboard key codes, the means for detecting the presence of the triggering sequence, the means for translating some of the codes into different codes, and for sending the translated codes to the computer, can easily be incorporated into the programming of the computer itself, and is considered to be part of the invention. Therefore, the scope of the invention is not to be limited by the above description, but is to be determined by the claims which follow.

The embodiments of the invention in which an exclusive property or privilege is claimed are defined as follows:

1. In a computer keyboard system comprising a plurality of keys and code generation means for producing a make code when a key is depressed and a break code when a key is released, an improvement comprising processing means coupled to receive the codes produced by the code generation means, the processing means comprising:

detection means for detecting a sequence of codes serially including a make code of a trigger key, a make code of a target key different from the trigger key, and a break code of the target key;

timing means, coupled to the detection means and including means for defining a predetermined non-zero triggering interval, said timing means determining whether a code sequence interval between the trigger key make code and the target key break code exceeds the predetermined non-zero triggering interval; and output means, coupled to the timing means and the detection means, for modifying the codes produced by the code generation means to produce modified codes when the sequence of codes has been detected and the triggering interval has been exceeded, and for outputting the modified codes.

2. The improvement of claim 1, wherein the triggering interval is less than 500 milliseconds.

3. The improvement of claim 1, wherein the triggering interval is in the range of 130-170 milliseconds.

4. The improvement of claim 1, wherein the triggering interval is about 150 milliseconds.

5. The improvement of claim 1, wherein the timing means determines whether the code sequence interval exceeds the triggering interval in response to detection of said sequence by the detection means.

6. The improvement of claim 1, wherein the trigger key is a space bar, wherein the target key is a touch-type key, and wherein the modified codes comprise a control key make code, and the make and break codes for the touch-type key.

7. The improvement of claim 1, wherein the trigger key comprises a first touch-type key, wherein the target key comprises a second touch-type key, and wherein the modified codes comprise the make and break codes of a non-touch-type key.

8. The improvement of claim 1, wherein the output means outputs the codes produced by the code generation means without modification if the sequence has not been detected or if the triggering interval is not exceeded.

9. In a computer keyboard system comprising a plurality of keys and code generation means for producing a make code when a key is depressed and a break code when a key is released, an improved method for processing codes produced by the code generation means comprising the steps of:
   detecting a sequence of codes serially including a make code of a trigger key, a make code of a target key different from the trigger key, and a break code of the target key;
   determining whether a code sequence interval between the trigger key make code and the target key break code exceeds a predetermined non-zero triggering interval; and
   modifying the codes produced by the code generation means to produce modified codes when the sequence of codes has been detected and the triggering interval has been exceeded, and outputting the modified codes.

10. The improved method of claim 9, wherein the triggering interval is less than 500 milliseconds.

11. The improved method of claim 9, wherein the triggering interval is in the range of 130-170 milliseconds.

12. The improved method of claim 9, wherein the triggering interval is about 150 milliseconds.

13. The improved method of claim 9, wherein the step of determining whether the code sequence interval exceeds the triggering interval is performed in response to detection of said sequence.

14. The improved method of claim 9, wherein the trigger key is a space bar, wherein the target key is a touch-type key, and wherein the modified codes comprise the control key make code, and the make and break codes for the touch-type key.

15. The improved method of claim 9, further comprising the step of outputting the codes produced by the code generation means without modification if the sequence has not been detected or if the triggering interval is not exceeded.

16. The improved method of claim 9, wherein the trigger key comprises a first touch-type key, wherein the target key comprises a second touch-type key, and wherein the modified codes comprise the make and break codes of a non-touch-type key.

17. In a computer keyboard system comprising a plurality of keys and code generation means for producing a make code when a key is depressed and a break code when a key is released, an improvement comprising processing means coupled to receive the codes produced by the code generation means, the processing means comprising:
   detection means for detecting a sequence of codes serially including a make code of a trigger key, a make code of a target key different from the trigger key, a break code of the target key, and a break code of the trigger key;
   timing means, coupled to the detection means and including means for defining a predefined non-zero triggering interval, for determining whether a code sequence interval between the trigger key make code and the target key break code exceeds the predetermined non-zero triggering interval; and
   output means, coupled to the timing means and the detection means, for modifying the codes produced by the code generation means to produce modified codes when the sequence of codes has been detected and the triggering interval has been exceeded, and for outputting the modified codes.

18. A computer keyboard system comprising:
   a plurality of keys including first and second null keys and a target key,
   code generation means for producing make and break codes when keys are depressed and released, respectively, the code generation means including means for producing first null make and break codes in response to depression and release of the first null key, means for producing second null make and break codes in response to depression and release of the second null key, and means for producing target make and break codes in response to depression and release of the target key; and
   processing means coupled to receive the sequence of codes produced by the code generation means, the processing means comprising detection means for detecting a sequence of codes that serially includes the second null make code and the target make code, and output means coupled to the processing means and responsive to the detection of said sequence of codes, for outputting modified codes in place of said sequence of codes, the modified codes comprising the first null make code followed by a second function make code different from the target make code.

19. The system of claim 18, wherein the first and second null keys comprise first and second control keys.

20. The system of claim 18, wherein the first and second null keys comprise first and second Alt keys.

21. The system of claim 18, wherein the first and second null keys comprise first and second Shift keys.

22. The system of claim 18, wherein when the codes produced by the code generation means comprise a sequence of codes serially including the first null make code and the target make code, the output means outputs the codes produced by the code generation means without modification.

23. The system of claim 18, wherein the plurality of keys does not include any key that, when depressed when no other key is depressed, will cause the code generation means to produce the second function make code.

24. The system of claim 18, wherein the detection means includes means for detecting a second sequence of codes serially including the second null make code and the second null break code, and wherein the output means includes means responsive to the detection of the second sequence for outputting modified codes in place of the detected codes, the modified codes comprising the make and break codes of a key different from the second null key.

* * * * *